(12) United States Patent
Polney

(10) Patent No.: US 6,525,597 B2
(45) Date of Patent: Feb. 25, 2003

(54) CIRCUIT CONFIGURATION WITH INTERNAL SUPPLY VOLTAGE

(75) Inventor: Jens Polney, München (DE)

(73) Assignee: Infineon Technologies AG, Müchen (DE)

( * ) Notice: Subject to any disclaimer, the term of this patent is extended or adjusted under 35 U.S.C. 154(b) by 0 days.

(21) Appl. No.: 10/008,114

(22) Filed: Nov. 8, 2001

(65) Prior Publication Data

US 2002/0063595 A1 May 30, 2002

(30) Foreign Application Priority Data

Nov. 8, 2000 (DE) .......................................... 100 55 242

(51) Int. Cl.$^7$ ................................................ G05F 1/10
(52) U.S. Cl. ....................... 327/540; 327/541; 327/380; 327/381
(58) Field of Search ................................. 327/540, 541, 327/542, 543, 401, 380, 381, 108–112, 436, 437; 326/80, 81, 82, 85, 87

(56) References Cited

U.S. PATENT DOCUMENTS 5,497,113 A  *  3/1996  Uber ........................... 327/170
5,870,346 A      2/1999  Komarek et al. ............ 365/226
5,973,549 A  * 10/1999  Yuh ............................ 327/541
5,982,705 A     11/1999  Tsukikawa ............. 365/230.08

FOREIGN PATENT DOCUMENTS

| DE | 198 29 287 A1 | 1/2000 |
| DE | 19829287 A1 | 1/2000 |
| EP | 0 469 588 A2 | 2/1992 |

* cited by examiner

*Primary Examiner*—Timothy P. Callahan
*Assistant Examiner*—An T. Luu
(74) *Attorney, Agent, or Firm*—Laurence A. Greenberg; Werner H. Stemer; Ralph E. Locher

(57) ABSTRACT

In integrated circuits with internally generated supply voltages, during the run-up of the internal voltage generators, unintentionally high currents can arise through switching stages connected to the internal supply voltage. A control circuit provides for the initialization of the switching stages during power-up. The control circuit contains an inverter that, in signal terms, can be driven by a precharge signal and, on the supply voltage side, is connected to the internal supply voltage via respective transistors. During power-up, the transistors are switched off and then switched on. The precharge signal is forwarded to the switching stage via a further inverter.

8 Claims, 3 Drawing Sheets

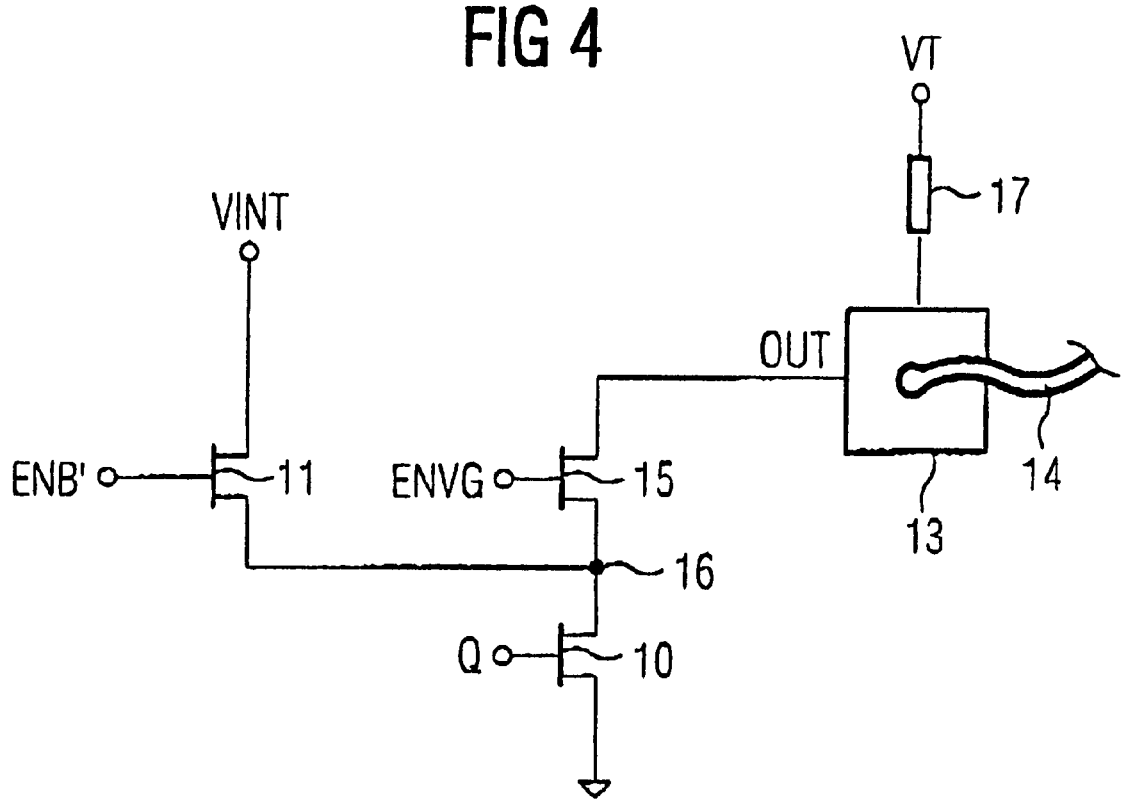
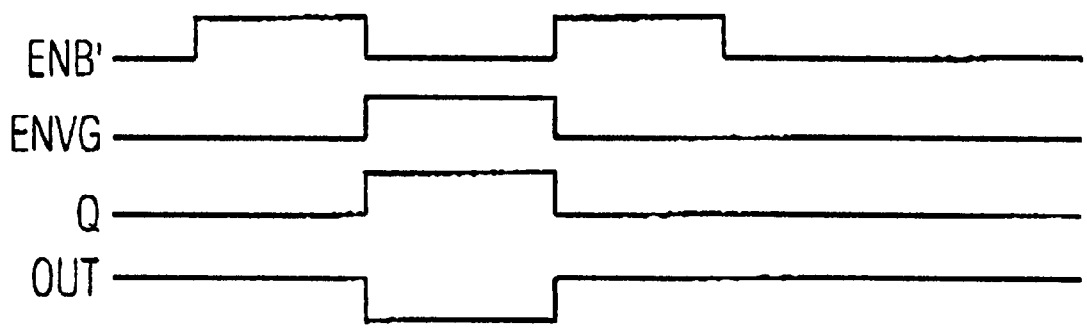

CIRCUIT CONFIGURATION WITH INTERNAL SUPPLY VOLTAGE

BACKGROUND OF THE INVENTION

FIELD OF THE INVENTION

The invention relates to a circuit configuration with an internally generated supply voltage that is derived from an externally applied supply voltage and drives current paths.

In modern integrated circuits, switching stages are supplied internally with supply voltages lower than externally applied supplies. As a result, the transistors can be dimensioned for a lower supply voltage and hence smaller. The internal supply voltage is generated by a voltage generator on the chip of the integrated circuit, which is supplied by the external supply voltage. Such supply voltage concepts are employed in particular in DRAMs, where at the present time the external supply voltage is 2.5 V, for example, and the internal supply voltage is 2.0 V.

Switching stages in the integrated circuit that are supplied by the internal supply voltage can be embodied as so-called dynamic logic. Such switching stages contain a current path including two transistors of the same channel type, for example n-channel MOS transistors, whose drain-source paths are connected in series between the terminal for the internal supply voltage and reference-ground potential (ground). One of the transistors is driven by a precharge signal which charges the output of the switching stage to the supply potential. In a subsequent operating clock cycle, a logic signal specifying the logic state to be transmitted is applied to the other of the transistors of the current path, which then leaves the output at supply potential or pulls it to ground.

The circuits that generate the precharge signal and the logic signal are likewise fed by the internal supply voltage. During the run-up of the voltage generator that generates the internal supply voltage, the problem exists that the logic levels for the precharge or logic signal are not defined and are established randomly. Thus, the case may occur in which both transistors of the current path of the dynamic switching stage are turned on completely or partly. There is then a conductive current path between the terminal for the internal supply voltage and the reference-ground potential. As a result, the voltage generator for the internal supply voltage is overloaded and may fail, so that the operating level for the internal supply voltage is not reached. Under certain circumstances, the voltage generator may be destroyed. The voltage generator would then have to be dimensioned for sufficiently high operating currents, that is to say larger than is actually necessary in normal operation. This results in a disproportionately high space requirement in the integrated circuit.

Published, Non-Prosecuted German Patent Application DE 198 29 287 A1 teaches a synchronous dynamic semiconductor memory having an initialization circuit that controls the switch-on operation. After stabilization of the supply voltage and processing of an initialization sequence, the SDRAM is prepared for normal operation. During the switch-on operation, care must be taken to ensure that the internal control circuits provided for proper operation are reliably kept in a defined desired state. Undesirable activation of output transistors, which, on the data lines, might bring about a short circuit or uncontrolled activation of internal current loads, is thereby prevented.

SUMMARY OF THE INVENTION

It is accordingly an object of the invention to provide a circuit configuration with an internal supply voltage that overcomes the above-mentioned disadvantages of the prior art devices of this general type, which operates with greater operational reliability in conjunction with a small area occupation in the case of integrated fabrication.

With the foregoing and other objects in view there is provided, in accordance with the invention, a circuit configuration. The circuit contains a terminal for receiving an external supply voltage and a voltage generator connected to the terminal and receives the external supply voltage. The voltage generator generates an internal supply voltage deviating from the external supply voltage and has a terminal for tapping off the internal supply voltage. A reference-ground potential terminal for a reference-ground potential is connected to the voltage generator. A switching stage is provided and receives the internal supply voltage and contains at least two transistors being of a same conductivity type. The two transistors have controlled current paths connected in series and define a coupling node at a connection point of the controlled current paths. A first transistor of the two transistors receives and is controlled by a logic control signal and a second transistor of the two transistors receives and is controlled by a precharge signal. A control circuit for generating the precharge signal is provided and is connected to the switching stage. The control circuit contains control transistors each having a control terminal and including a first control transistor and a second control transistor having a conductivity type opposite the first control transistor. The first control transistor is connected to the terminal of the voltage generator for receiving the internal supply voltage. The second control transistor is connected to the reference ground potential terminal. A first inverter is provided and has an input receiving and controlled by a further precharge signal and, supply voltage terminals connected to one of the first control transistor and the second control transistor. The first and second control transistors are driven in a complementary manner by a control signal indicating a state of the internal supply voltage. In addition, the first inverter has an output. A second inverter is provided and has an input connected to the output of the first inverter and an output terminal providing the precharge signal.

In the circuit configuration according to the invention, circuit nodes of the switching stages supplied by the internal supply voltage are initialized. Therefore, in the presence of an internal supply voltage that is not yet high enough for correct operation, the critical circuit nodes are driven in such a way that a conductive current path between the internal supply voltage and the reference-ground potential is reliably avoided. The control circuit ensures that the precharge signal, during the initialization phase, always has a logic level such that the precharge transistor is reliably turned off. In n-channel MOS precharge transistors, the precharge signal always has a low level during the initialization phase. Only after the availability of a sufficiently high internal supply voltage is the precharge signal enabled and can be controlled cyclically in accordance with the desired signal processing.

The output-side inverter of the control circuit can advantageously be clamped to the external supply voltage by a third transistor during the initialization phase. This ensures that the output of the inverter reliably assumes a level such that the precharge transistor of the switching stage is switched off. The inverter is expediently driven by the internal supply voltage, so that only as few functional elements as possible are supplied by the external supply voltage.

The precharge signal provided on the input side is blocked by the first inverter and first and second transistors which connect the inverter, on the supply voltage side, to the internal supply voltage or the reference-ground potential, until a sufficiently high internal supply voltage is available. This state is indicated by a corresponding control signal. The control signal is applied in a complementary manner to the transistors that connect the first inverter to the internal supply voltage or the reference-ground potential. The control signal is fed directly, in non-inverted form, to one of the transistors; the control signal is fed in inverted form, via an inverter, to the other of the transistors. The inverter can expediently be supplied with an operating voltage by the external supply voltage.

The invention is advantageous particularly when the switching stage to be initialized is disposed in an output driver of the circuit. The output terminal of the output driver is then connected to a pad. This is a relatively large metallization area on which a bonding wire is stamped, the bonding wire being connected to a terminal pin of a housing. The output driver has transistors of relatively large dimensions with a high current driver capability, with the result that external lines connected to the terminal pin of the housing, the lines running on a circuit board for example, can be driven. If such a current path formed a conductive connection between the internal supply voltage and the reference-ground potential in an impermissible manner during the start-up of the voltage generator providing the internal supply voltage, a relatively high shunt current could flow. By virtue of the invention, in the case of an output driver, such an impermissible state is avoided by the intialization described above.

The control signal that indicates a sufficiently high internal supply voltage is available may be a logic signal that compares the internally generated supply voltage with a threshold value. As an alternative, the control signal can be derived directly by level conversion from the internally generated supply voltage. A level converter is supplied by the external supply voltage and converts the instantaneous level of the internal supply voltage to a logic level referred to the external supply voltage.

In accordance with an added feature of the invention, the control circuit has a third transistor with a controlled path connected between the input of the second inverter and the terminal for the external supply voltage. The third transistor receives and is driven by the control signal indicating the state of internal supply voltage.

In accordance with an additional feature of the invention, the second inverter is connected to the terminal for the internal supply voltage.

In accordance with another feature of the invention, the control signal indicating the state of the internal supply voltage is applied to the control terminal of the second control transistor. A third inverter is provided and is connected to the control terminal of the first control transistor and receives the control signal indicating the state of the internal supply voltage. The third inverter outputs an inverted control signal received by the control terminal of the first control transistor, and the third inverter is connected to the terminal for the external supply voltage.

In accordance with a further feature of the invention, a pad is provided, and the switching stage forms an output driver of an integrated circuit and has an output connected to the pad where a signal can be tapped off from the integrated circuit.

In accordance with a further added feature of the invention, the switching stage has a third transistor with a controlled path connected between the coupling node and the pad. The third transistor receives and is controlled by a further control signal.

In accordance with a further additional feature of the invention, the internal supply voltage, with reference to the reference-ground potential, has a smaller magnitude than the external supply voltage.

In accordance with a concomitant feature of the invention, a level converter having an output connected to the control circuit is provided. The level converter generates the control signal indicating the state of the internal supply voltage and can be tapped off at the output of the level converter. The level converter is connected to the terminal for the external supply voltage and has a signal input receiving and driven by the internal supply voltage.

Other features which are considered as characteristic for the invention are set forth in the appended claims.

Although the invention is illustrated and described herein as embodied in a circuit configuration with an internal supply voltage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a circuit diagram of a circuit configuration according to the invention specifically for an output driver of an integrated circuit; and FIG. 5 is a logic signal diagram for the circuit shown in FIG. 4.

DESCRIPTION OF THE PREFERRED EMBODIMENTS

Figure 1:
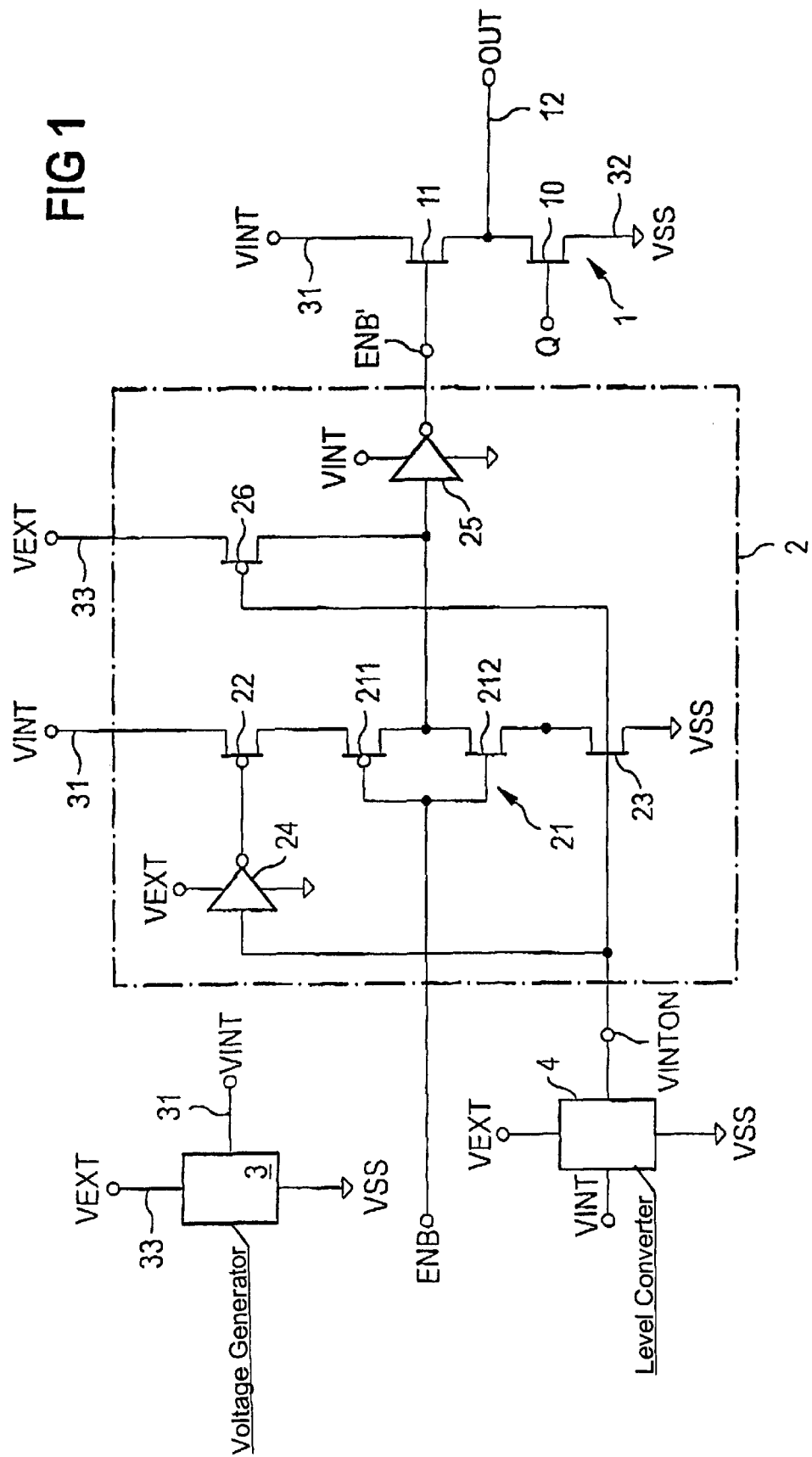
FIG. 1 is a circuit diagram of a circuit configuration according to the invention.

Referring now to the figures of the drawing in detail and first, particularly, to FIG. 1 thereof, there is shown a dynamic switching stage 1. The switching stage has two n-channel MOS transistors 10, 11, which are connected in series by their drain-source paths. The series circuit is connected between terminals 31, 32 for an internal supply voltage generated by a voltage generator 3. A negative pole of the internal supply voltage is formed by a reference-ground potential VSS at the terminal 32. A positive pole of the internal supply voltage is formed by a supply potential VINT at the terminal 31. The supply voltage generator 3 is fed by an externally provided supply voltage VEXT and generates, by suitable known regulating circuits, the on-chip supply potential VINT or the corresponding internal supply voltage VINT formed relative to the reference-ground potential VSS. The internal supply voltage VINT is 2.0 V in the exemplary embodiment. The transistor 11 of the dynamic output driver 1 is driven by a precharge signal ENB'. A high level of the signal ENB' turns the transistor 11 on, with the result that an output 12 of the dynamic switching stage 1 is precharged to the internal supply potential VINT−Vthn. In this case, Vthn is the threshold voltage of the n-charge transistor 11. In a next operating clock cycle, the precharge signal ENB' is switched off again, with the result that the level of the output signal OUT at the terminal 12 is set by the logic signal Q, which drives the transistor 10. A low level of the signal Q turns the transistor 10 off, with the result that a high level is still present for the output signal OUT. A high level of the signal Q turns the transistor 10 on, with the result that the output 12 is pulled to a reference-ground potential VSS.

Figure 2:
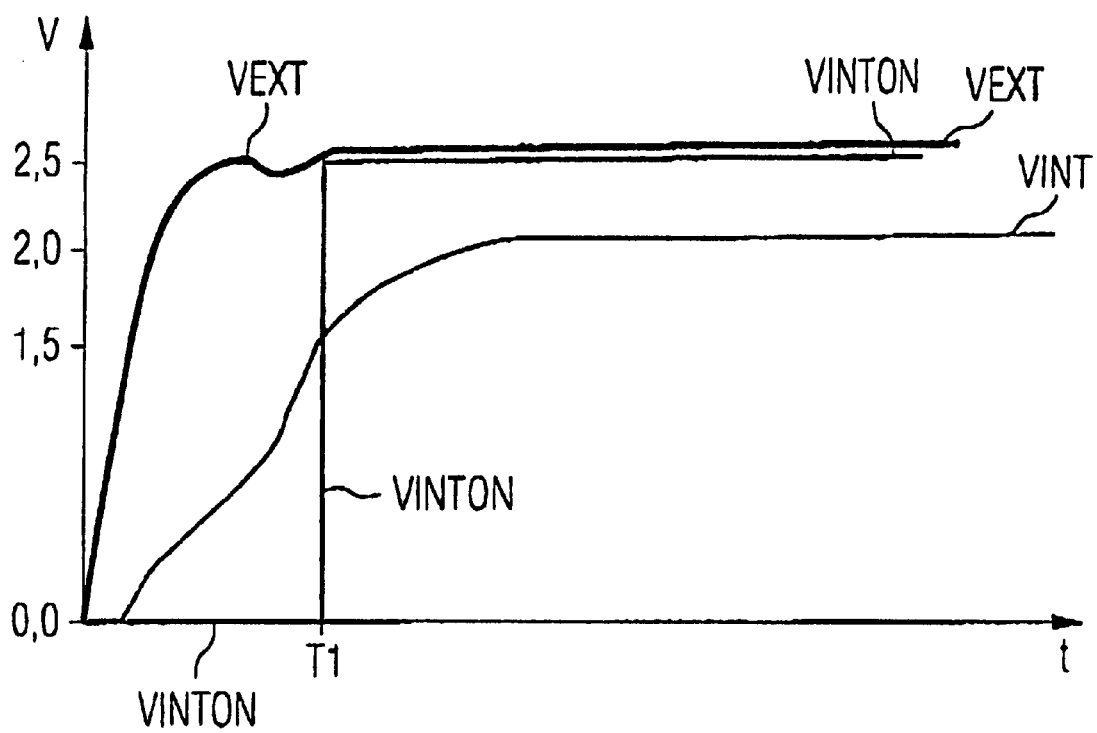
FIG. 2 is a graph showing a signal diagram of voltages and signals that occur in the circuit shown in FIG. 1.
Figure 3:
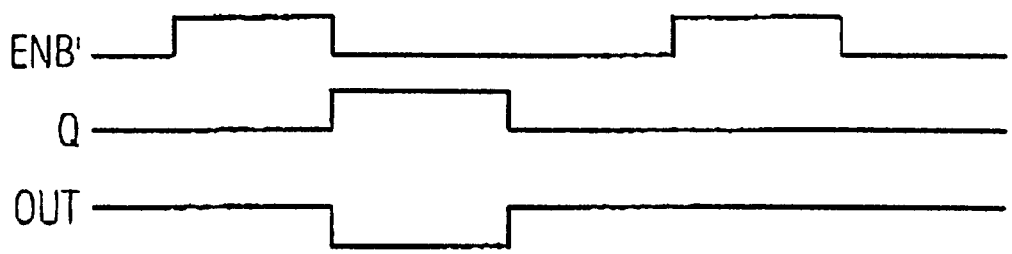
FIG. 3 is a logic signal diagram of signals that occur in the circuit shown in FIG. 1.

As long as the internal supply voltage VINT has not yet reached its operationally reliable, sufficiently high continuous operation level, the transistors 11, 10 could both be turned on simultaneously in the absence of the circuit configuration according to the invention. There would then be a conductive current path between the terminals 31, 32 for the internal supply voltage, the current path excessively loading the voltage generator 3. A control circuit 2 serves for avoiding such switching states during the power-up phase for the internal supply voltage VINT. On an input side, the control circuit 2 is fed a precharge signal ENB, generated by switching stages connected upstream, and, in addition, a control signal VINTON which specifies that the voltage generator 3 has an output voltage ready for operation. As illustrated in FIG. 2, an external supply voltage VEXT has a level of 2.5 V. The internal supply voltage VINT is generated by the voltage generator 3 only after the availability of a sufficiently high external supply voltage VEXT. It rises relatively slowly. When a sufficiently high internal supply voltage VINT is reached, for example 1.5 V in FIG. 2, the a signal VINTON is activated.

The control circuit 2 has an inverter 21, whose signal input, i.e. the interconnected gate terminals of transistors 211, 212, is driven by the precharge signal ENB. Supply voltage terminals of the inverter 21 are connected to the internal supply voltage VINT via a p-channel MOS transistor 22 and are additionally connected to the terminal for reference-ground potential VSS via an n-channel MOS transistor 23. The current path formed from the transistors 22, 211, 212, 23 is thus connected to the internal supply voltage VINT. The transistor 23 is driven directly by the control signal VINTON. The transistor 22 is driven complementarily thereto. An inverter 24 inverts the signal VINTON and, on an output side, is connected to a gate terminal of the transistor 22. The inverter 24 is supplied by the external supply voltage VEXT.

During the initialization phase before an instant T1, the signal VINTON has a low level. The transistors 23, 22 are thus in the off state. Since the inverter 24 is supplied by the external supply voltage VEXT, the output level of the inverter 24 is at a magnitude of the external supply voltage VEXT during the initialization phase. The p-channel MOS transistor 22 is thus reliably switched off. Consequently, the inverter 21 is not supplied with supply voltage during the initialization phase, thereby avoiding the forwarding of any level of the signal ENB. The output of the inverter 21 is connected to an input of an inverter 25 which, on the output side, carries the initialized precharge signal ENB'. On the supply voltage side, the inverter 25 is fed by the internal supply voltage VINT. In order to ensure that the output-side precharge signal ENB' has a low level during the initialization phase before the instant T1, the input of the inverter 25 is clamped to a terminal 33 for the external supply potential VEXT via a p-channel MOS transistor 26. A gate terminal of the transistor 26 is driven directly by the signal VINTON, with the result that the transistor 26 is in the on state during the initialization phase and holds the input of the inverter 25 at the high level formed by the external supply voltage VEXT.

When the internal supply voltage VINT reaches a level value of 1.5 V, the signal VINTON is changed over from a low level to a high level (FIG. 2). The transistors 22, 23 are thus turned on. The supply voltage terminals of the transistor 21 are connected to the internal supply voltage VINT and ground VSS, respectively. Furthermore, the transistor 26 is switched off. Consequently, a level change—present on the input side—in the precharge signal ENB is forwarded to the output of the inverter 25 as the signal ENB'. The control circuit 2 is then transparent.

The signal VINTON can be generated by a comparison of the voltage VINT generated by the generator 3 with a threshold value of 1.5 V. As an alternative, it is possible to provide a level converter 4 to which the internal supply voltage VINT can be fed directly and which is supplied by the external supply voltage VEXT. The level converter 4 has switching characteristics, so that when the threshold of 1.5 V is exceeded by the internal supply voltage VINT, on the output side, the control signal VINTON is generated with logic levels of the magnitude of the external supply voltage VEXT.

The n-channel MOS transistors and p-channel MOS transistors illustrated have the n and p conductivity types, respectively. The controlled paths of the transistors are their respective drain-source paths. The control terminals of the transistors are their gate terminals.

In FIG. 4, the output 12 is connected directly to a pad 13. A bonding wire 14 is stamped onto the pad 13, the bonding wire connecting the circuit output to a housing pin. The housing pin is connected to lines on a circuit board. In order to be able to set the edge steepness of the switching stage 1, serving as an output driver, to a predetermined value, an n-channel MOS transistor 15 is additionally provided. A drain-source path of the transistor 15 is connected to a coupling node 16 of the transistors 10, 11, at one end, and to the pad 13, at the other end. The pad 13 is connected to a supply potential VT via a pull-up resistor 17. The transistor 11 serves for precharging the node 16 to VINT−Vthn. What is achieved as a result is that when a high level is output via the pad 13, no capacitive compensating current flows into the node 16. The transistor 15 is driven by a control signal ENVG. The transistor 15 sets the edge steepness of a switching edge of the signal level that is to be output and is defined by the signal Q.

I claim:

1. A circuit configuration, comprising:
   a terminal for receiving an external supply voltage;
   a voltage generator connected to said terminal and receiving the external supply voltage, said voltage generator generating an internal supply voltage deviating from the external supply voltage, said voltage generator having a terminal for tapping off the internal supply voltage;
   a reference-ground potential terminal for a reference-ground potential connected to said voltage generator;
   a switching stage receiving the internal supply voltage and containing at least two transistors being of a same conductivity type, said two transistors having controlled current paths connected in series and defining a coupling node at a connection point of said controlled current paths, a first transistor of said two transistors receiving and controlled by a logic control signal and a second transistor of said two transistors receiving and controlled by a precharge signal; and
   a control circuit for generating the precharge signal and connected to said switching stage, said control circuit including:

control transistors each having a control terminal and including a first control transistor and a second control transistor having a conductivity type opposite said first control transistor, said first control transistor connected to said terminal of said voltage generator for receiving the internal supply voltage, said second control transistor connected to said reference ground potential terminal;

a first inverter having an input receiving and controlled by a further precharge signal and, supply voltage terminals connected to one of said first control transistor and said second control transistor, said first and second control transistors able to be driven in a complementary manner by a control signal indicating a state of the internal supply voltage, said first inverter having an output; and a second inverter having an input connected to said output of said first inverter and an output terminal providing the precharge signal.

2. The circuit configuration according to claim 1, wherein said control circuit has a third transistor with a controlled path connected between said input of said second inverter and said terminal for the external supply voltage, said third transistor receiving and driven by the control signal indicating the state of internal supply voltage.

3. The circuit configuration according to claim 1, wherein said second inverter is connected to said terminal for the internal supply voltage.

4. The circuit configuration according to claim 1,
wherein the control signal indicating the state of the internal supply voltage is applied to said control terminal of said second control transistor; and including a third inverter connected to said control terminal of said first control transistor and receiving the control signal indicating the state of the internal supply voltage, said third inverter outputting an inverted control signal received by said control terminal of said first control transistor, and said third inverter connected to said terminal for the external supply voltage.

5. The circuit configuration according to claim 1, including a pad, and said switching stage forms an output driver of an integrated circuit and has an output connected to said pad where a signal can be tapped off from said integrated circuit.

6. The circuit configuration according to claim 5, wherein said switching stage has a third transistor with a controlled path connected between said coupling node and said pad, said third transistor receiving and controlled by a further control signal.

7. The circuit configuration according to claim 1, wherein said internal supply voltage, with reference to the reference-ground potential, has a smaller magnitude than the external supply voltage.

8. The circuit configuration according to claim 1, including a level converter having an output connected to said control circuit, said level converter generating the control signal indicating the state of the internal supply voltage and can be tapped off at said output of said level converter, said level converter connected to said terminal for the external supply voltage and has a signal input receiving and driven by the internal supply voltage.

* * * * *